(12) United States Patent
Rodriguez et al.

(10) Patent No.: US 10,123,436 B2
(45) Date of Patent: Nov. 6, 2018

(54) LIVE LOAD INDICATOR WITH DOOR INTERLOCK

(71) Applicant: SCHNEIDER ELECTRIC USA, INC., Andover, MA (US)

(72) Inventors: Vladimir Cano Rodriguez, Apodaca (MX); Gerardo Rodriguez Najera, San Nicolas de Los Graza (MX)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 233 days.

(21) Appl. No.: 15/129,530

(22) PCT Filed: Mar. 31, 2014

(86) PCT No.: PCT/US2014/032377
§ 371 (c)(1),
(2) Date: Sep. 27, 2016

(87) PCT Pub. No.: WO2015/152874
PCT Pub. Date: Oct. 8, 2015

(65) Prior Publication Data
US 2017/0105299 A1    Apr. 13, 2017

(51) Int. Cl.
*H05K 5/02*     (2006.01)
*G01R 19/15*    (2006.01)
(Continued)

(52) U.S. Cl.
CPC ....... *H05K 5/0208* (2013.01); *E05B 47/0603* (2013.01); *E05B 65/00* (2013.01);
(Continued)

(58) Field of Classification Search
CPC .................................................. H05K 5/0208
(Continued)

(56) References Cited

U.S. PATENT DOCUMENTS 2,013,241 A   9/1935   Hefner
3,142,003 A   7/1964   Olashaw
(Continued)

FOREIGN PATENT DOCUMENTS

CN   102779669 A   6/1986
EP   2110826      10/2009
(Continued)

OTHER PUBLICATIONS

Ward et al., "Using Rogowski coils for transient current measurements", Engineering Science and Education Journal. Jun. 1993, retrieved from the Internet: http://homepage.ntlworld.com/rocoil/PR7o.pdf; pp. 105-113.

(Continued)

*Primary Examiner* — Fritz M Fleming
(74) *Attorney, Agent, or Firm* — Locke Lord LLP

(57) ABSTRACT

A monitoring system is provided for monitoring a status of current supply through a current supply conductor 5 in an electrical housing 1. A current transformer 13 and a monitoring circuit 15 monitor the conductor 5 in the housing 1. The monitoring circuit 15 is powered by current induced in the transformer from current in the conductor. The monitoring circuit 15 is configured to output a signal on an output line 14 indicating whether the current in the conductor is on or off. The monitoring circuit 15 is connected to at least one of a display device 24 and a door interlock 8 of a door of the housing 1 to, respectively, indicate whether the current in the conductor 5 is on or off and to prevent the door 17 of the housing 1 from opening when the signal on the output line 14 indicates that the current is on.

17 Claims, 9 Drawing Sheets

(51) Int. Cl.
  *E05B 47/06* (2006.01)
  *E05B 65/00* (2006.01)
  *G05B 9/02* (2006.01)
  *H02B 1/06* (2006.01)
  *H05K 5/00* (2006.01)

(52) U.S. Cl.
  CPC ............... *G01R 19/15* (2013.01); *G05B 9/02* (2013.01); *H02B 1/06* (2013.01); *H05K 5/0017* (2013.01)

(58) Field of Classification Search
  USPC ........................................................ 307/328
  See application file for complete search history.

(56) References Cited

U.S. PATENT DOCUMENTS

| | | | |
|---|---|---|---|
| 4,033,660 | A | 7/1977 | Ericson et al. |
| 4,139,748 | A | 2/1979 | Wolfe et al. |
| 4,572,973 | A | 2/1986 | Tanaka |
| 4,789,919 | A | 12/1988 | Cox et al. |
| 5,486,663 | A | 1/1996 | Fritsch et al. |
| 5,510,960 | A | 4/1996 | Rosen |
| 5,877,691 | A | 3/1999 | Suptitz et al. |
| 5,892,430 | A | 4/1999 | Weisman |
| 5,963,420 | A * | 10/1999 | Bailey .................. H05K 5/0208 200/50.02 |
| 6,337,449 | B1 | 1/2002 | Brouillat et al. |
| 6,472,971 | B2 | 10/2002 | Toyama et al. |
| 6,486,421 | B1 | 11/2002 | Jones et al. |
| 6,798,209 | B2 | 9/2004 | Lavoie et al. |
| 6,842,325 | B2 | 1/2005 | Meehleder et al. |
| 6,847,297 | B2 | 1/2005 | Lavoie et al. |
| 6,868,349 | B2 | 3/2005 | Fletcher et al. |
| 6,954,060 | B1 | 10/2005 | Edel |
| 7,403,015 | B2 | 7/2008 | Carlino et al. |
| 7,417,554 | B2 | 8/2008 | Benke et al. |
| 7,436,641 | B2 | 10/2008 | Holley |
| 7,579,963 | B2 | 8/2009 | Viaro et al. |
| 7,973,431 | B2 * | 7/2011 | Feldmeier ............... D06F 37/42 307/113 |
| 8,018,097 | B2 | 9/2011 | Saito et al. |
| 8,476,992 | B2 | 7/2013 | Yang et al. |
| 8,760,825 | B2 | 6/2014 | Erger et al. |
| 9,910,467 | B2 * | 3/2018 | Barron ................. H05K 5/0208 |
| 2001/0052843 | A1 | 12/2001 | Wiesman et al. |
| 2003/0053279 | A1 | 3/2003 | Meehleder et al. |
| 2004/0178875 | A1 | 9/2004 | Saito |
| 2005/0275493 | A1 | 12/2005 | Yamazaki et al. |
| 2006/0176630 | A1 | 8/2006 | Carlino et al. |
| 2006/0271314 | A1 | 11/2006 | Hayes |
| 2008/0079436 | A1 | 4/2008 | Gollhardt et al. |
| 2008/0258667 | A1 | 10/2008 | Morris et al. |
| 2010/0084920 | A1 | 4/2010 | Banting et al. |
| 2010/0118473 | A1 | 5/2010 | Morris et al. |
| 2010/0280775 | A1 | 11/2010 | Schafer et al. |
| 2011/0110049 | A1 | 5/2011 | Lehtola et al. |
| 2011/0149480 | A1 | 6/2011 | Leeman et al. |
| 2011/0252845 | A1 | 10/2011 | Webb et al. |
| 2012/0039061 | A1 | 2/2012 | McBee et al. |
| 2012/0064746 | A1 | 3/2012 | Bellows et al. |
| 2012/0086433 | A1 | 4/2012 | Cheng et al. |
| 2012/0123762 | A1 | 5/2012 | Studer et al. |
| 2012/0127636 | A1 | 5/2012 | Abrahamsen et al. |
| 2012/0146661 | A1 | 6/2012 | Thomas |
| 2012/0228097 | A1 | 9/2012 | Gemme et al. |
| 2013/0054162 | A1 | 2/2013 | Smith |
| 2013/0107412 | A1 | 5/2013 | Schalk et al. |
| 2013/0108027 | A1 | 5/2013 | Kioski et al. |
| 2013/0200971 | A1 | 8/2013 | Crutcher et al. |
| 2014/0015516 | A1 | 1/2014 | Sorensen et al. |
| 2014/0062459 | A1 | 3/2014 | El-Essawy et al. |
| 2015/0002138 | A1 | 1/2015 | Fox |
| 2015/0171605 | A1 | 6/2015 | Jo et al. |

FOREIGN PATENT DOCUMENTS

| | | |
|---|---|---|
| WO | 2010005658 A1 | 1/2010 |
| WO | WO2010119332 | 10/2010 |
| WO | WO2011000838 | 1/2011 |
| WO | WO2012054337 | 4/2012 |

OTHER PUBLICATIONS

International Search Report and Written Opinion dated Aug. 12, 2014 in PCT/US2014/032377, 18pp.

* cited by examiner

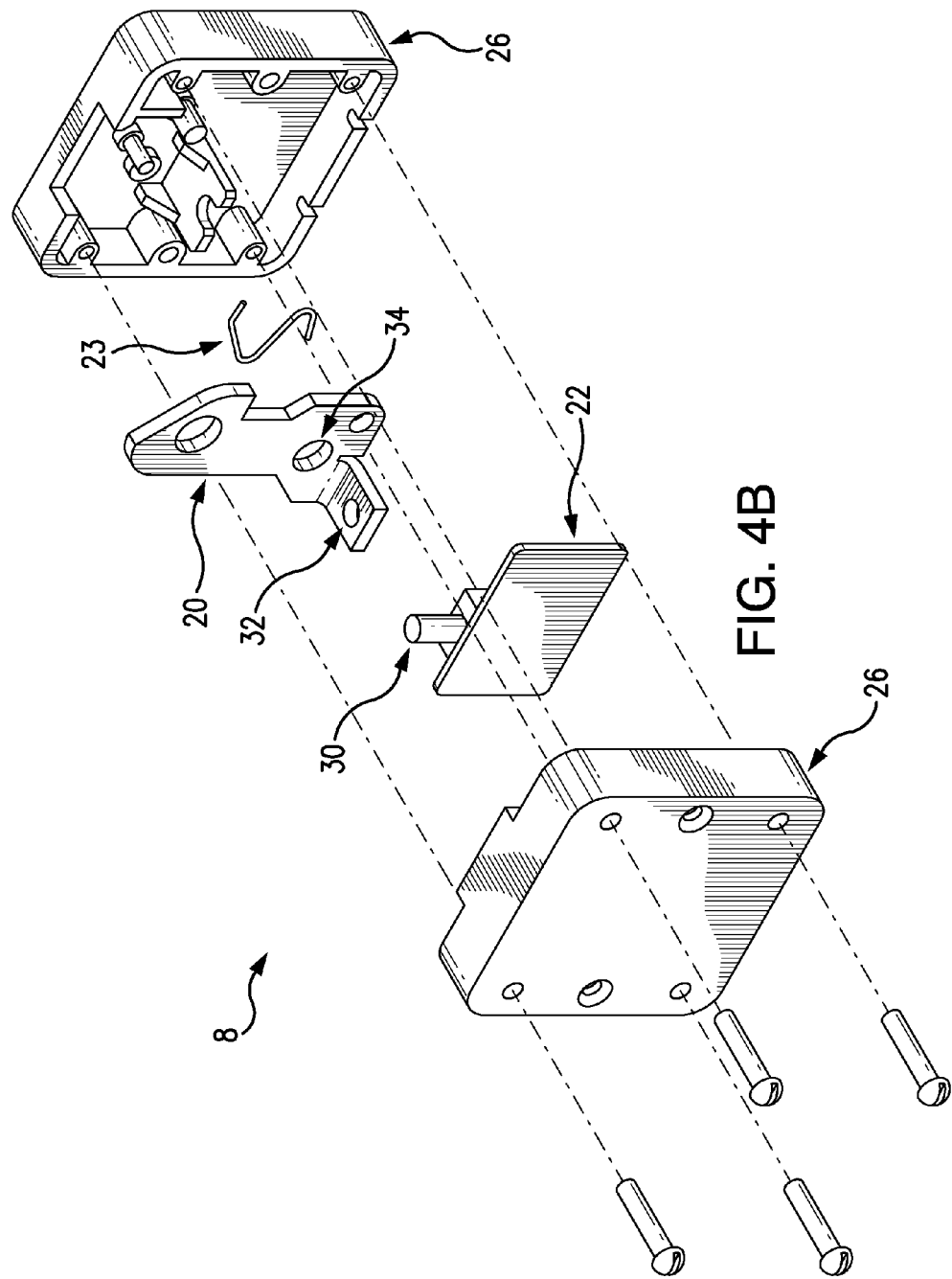

LIVE LOAD INDICATOR WITH DOOR INTERLOCK

FIELD OF THE INVENTION

The invention disclosed relates to electrical power distribution enclosures.

BACKGROUND

When inserting, removing or working on electrical components in an electrical housing, such as a load center or motor control center unit, an operator typically turns off the power to the electrical housing beforehand. Otherwise, the operator may be exposed to serious electrical hazard, such as an energized conductor or an arc flash.

SUMMARY

The invention provides simple, practical, and relatively inexpensive equipment to indicate that there is a live wire, such as a main supply line feed, within an electrical enclosure housing structure, by indicia or by preventing the housing from opening, or both. The invention requires no external wiring to power its operations and does not require modification of or connection to the electrical components in the electrical housing. Instead, a current transformer with an integrated monitoring circuit is placed around a current supply conductor to be monitored in the electrical housing. The monitoring circuit is powered by current induced in the current transformer from current in the current supply conductor being monitored. The monitoring circuit is configured to output a signal on a output line indicating whether the current in the monitored current supply conductor is on or off.

The monitoring circuit is connected to at least one of a display device and a door interlock of the electrical enclosure, to indicate whether the current in the monitored current supply conductor is on or off. The door interlock prevents the door of the electrical enclosure from opening when the signal on the output line indicates that the current is on.

The current transformer with an integrated monitoring circuit has a small form factor to enable fitting within the limited space available in the electrical enclosure. The current transformer with an integrated monitoring circuit may be easily retrofitted on the current supply conductor in the electrical enclosure.

DESCRIPTION OF THE FIGURES

FIG. 4B shows an exploded, front perspective view from the bottom left side of the door interlock, illustrating example details of a latch and solenoid of the door interlock, which operate in response to the signal on the output line from the supply line monitor, indicating whether current through the current supply conductor is on or off.

FIG. 5B is a side cross sectional view of the door interlock, illustrating example details of the latch bolt of the solenoid, which is extended by the solenoid into the bolt hole of the latch, to lock the door of the electrical enclosure housing structure when the signal on the output line from the supply line monitor, indicates that the current through the current supply conductor is on.

FIG. 7B-1 shows a front perspective view from the top right side of an example embodiment of the electrical enclosure housing structure, with the display indicating that the current through any current supply conductor is on, by showing a message, for example, "ON".

FIG. 7B-2 shows a front perspective view from the top right side of an example embodiment of the electrical enclosure housing structure, with the display indicating that the current through all current supply conductors is off, by showing a message, for example, "UNLOCK". The display may be a bistable display having a first stable state indicating that the current through any current supply conductor is on and a second stable state indicating that the current through all current supply conductors is off.

DESCRIPTION OF EMBODIMENTS OF THE INVENTION

Figure 1:
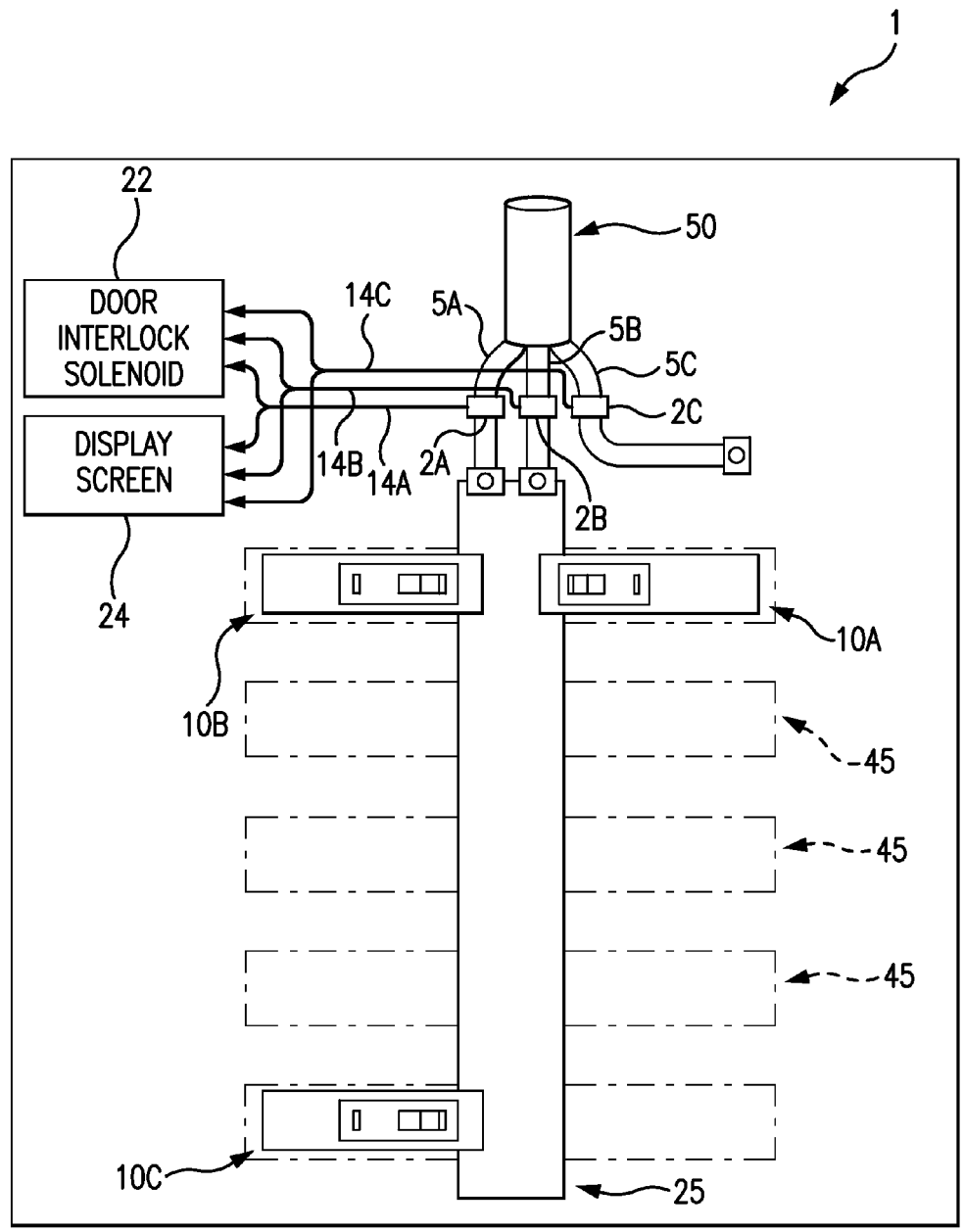
FIG. 1 illustrates an example embodiment of an electrical enclosure, comprising a housing structure containing an electrical power supply cable with three current supply conductors and at least one electrical device, and a supply line monitor surrounding each current supply conductor. When any of the current supply conductors conducts a current, the supply line monitor surrounding that current supply conductor is configured to output a signal on an output line to at least one of a display device and a door interlock of a door of the housing, indicating whether current through the current supply conductor is on or off.

FIG. 1 illustrates an example embodiment of an electrical enclosure, such as a load center, comprising a housing structure 1 containing an electrical power supply cable 50 and at least one electrical device, such as circuit breakers 10A, 10B, and 10C in branch location slots 45, meters, switches, and the like. The example electrical power supply cable 50 shown in the figure, includes three current supply conductors 5A, 5B, and 5C that may provide the main electrical power to a power bus 25 of the electrical enclosure housing 1. In example embodiments, the electrical power supply cable 50 may be, for example, a regular residential three wire cable having two incoming hot wires 5A and 5B having opposite phases, and one neutral wire 5C that returns the current flowing in the two hot wires. Each of the three current supply conductors 5A, 5B, and 5C includes a respective supply line monitor 2A, 2B, and 2C that is configured to output a signal on a respective output line 14A, 14B, and 14C to at least one of a display device 24 and a door interlock solenoid 22 of a door interlock 8 (shown in FIG. 4A). The display is mounted on the outside of the housing structure 1, to indicate whether current through any of the current supply conductors 5A, 5B, or 5C is on or whether all are off. The door interlock is mounted on the inside of the housing structure and located proximate to an access door of the housing structure, to prevent the door of the electrical housing from opening when the signal on any output line 14A, 14B, or 14C indicates that the current is on in the respective current supply conductor 5A, 5B, or 5C.

Figure 2:
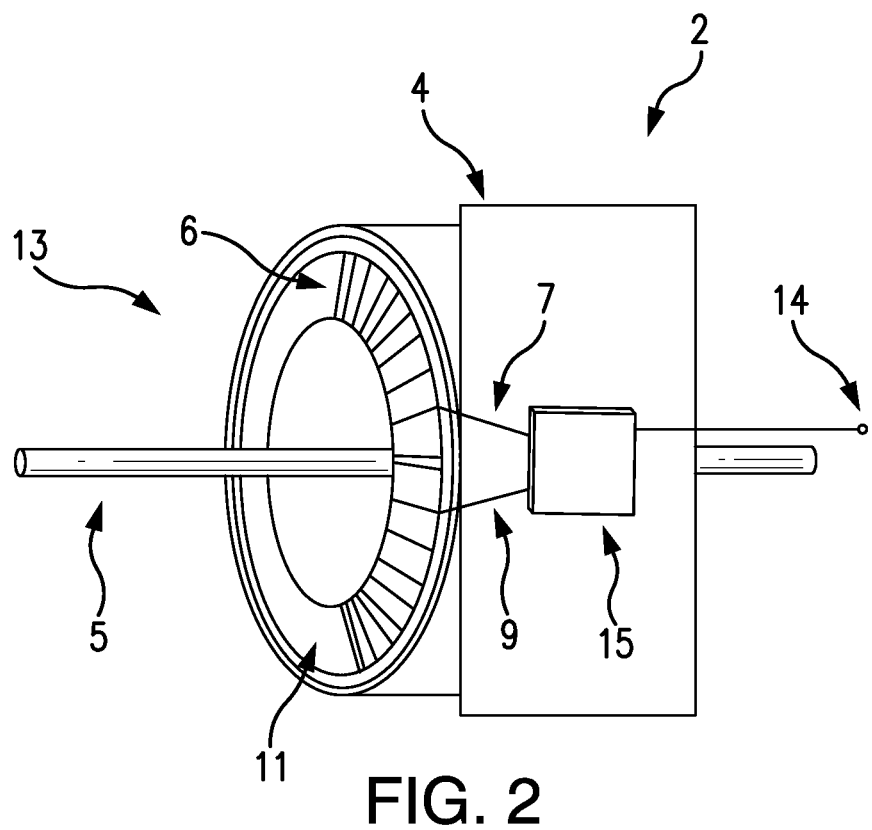
FIG. 2 shows the supply line monitor including a monitoring circuit electrically connected to a current transformer, whose operating power is provided by current induced in the current transformer from current in the current supply conductor, to monitor the current in the current supply conductor, and output a signal on an output line indicating whether current through the current supply conductor is on or off.

FIG. 2 illustrates the supply line monitor 2A, 2B, or 2C of FIG. 1, referred to herein generally as 2, with a printed circuit board 4 adjacent to the outside circumference of a current transformer 13. The current transformer 13 surrounds the respective current supply conductor 5A, 5B, or 5C of FIG. 1, referred to herein generally as 5. The current transformer 13 includes a toroidal sensor coil 6 and a high magnetic permeability toroidal core 11. The sensor coil 6 may be magnet wire wound as a toroidal coil about a high magnetic permeability toroidal core 11, forming a toroidal current transformer. The toroidal core 11 has the current supply conductor 5 passing through the toroidal core's center. The toroidal core 11 may be composed of a ferromagnetic material having a high permeability, such as silicon steel or high permeability ferrite.

A monitoring circuit 15 is shown formed on the printed circuit board 4 and is connected to leads 7 and 9 from the sensor coil 6. The monitoring circuit 15 is shown connected to its respective output line 14A, 14B, or 14C of FIG. 1, referred to herein generally as 14. The current supply conductor 5 is shown passing through the center of the toroidal core 11. The monitoring circuit 15 is electrically connected to the current transformer 13, whose operating power is provided by current induced in the current transformer 13 from current in the current supply conductor 5. The monitoring circuit 15 uses the operating power to monitor the current in the current supply conductor 5, and output a signal on the output line 14 indicating whether current through the current supply conductor 5 is on or off.

The printed circuit board 4 may comprise a flexible substrate having conductive lines deposited thereon. The monitoring circuit 15 may be attached to the flexible substrate and electrically interconnected by the conductive lines. The flexible substrate of the flexible printed circuit board 4 may have an adhesive coating on a backside thereof to fasten the flexible printed circuit board 4 to the toroidal coil's 11 outside circumference.

The supply line monitor 2 has a small form factor to enable fitting within the limited space available in a load center, for example. Since there are no terminals or exposed wires, the supply line monitor 2 may be made very robust and essentially immune from electrical noise sources. In example embodiments, the toroidal core 11 and toroidal sensor coil 6 of the current transformer 13 may be formed in two halves to facilitate installation around the current supply conductor 5.

Figure 3:
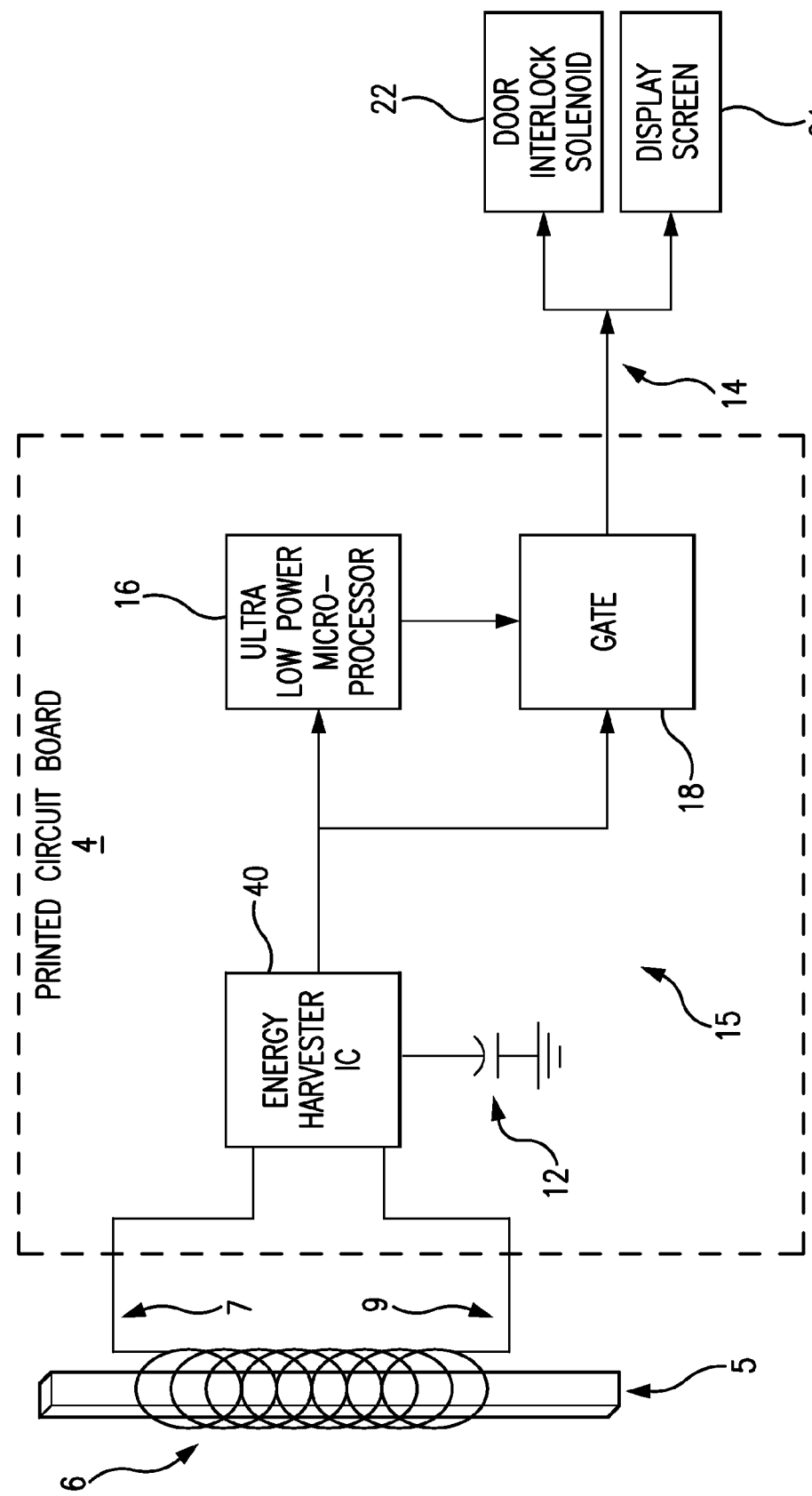
FIG. 3 shows a circuit diagram of the current transformer and the monitoring circuit that includes an energy harvester circuit and a microprocessor, to output the signal to a door interlock solenoid and/or the display screen, indicating whether current through the current supply conductor is on or off.

FIG. 3 shows a circuit diagram of the current transformer and the monitoring circuit that includes an energy harvester circuit and a microprocessor, to output the signal to the door interlock solenoid and/or the display screen, indicating whether current through the current supply conductor 5A, 5B, or 5C of FIG. 1, referred to herein generally as 5 is on or off. In this example, the printed circuit board 4 may include the energy harvesting circuit 40, a super capacitor 12, a data processing device such as a micro-processor 16 (in communication with a memory, not shown), and a gate 18.

The current in the current supply conductor 5 is an alternating current, which induces an alternating current in the sensor coil 6 by means of electromagnetic induction. The alternating magnetic field produced by the current supply conductor 5, inductively couples with the sensor coil 6, thereby producing the induced alternating current in the sensor coil 6. The induced alternating current in the sensor coil 6 is substantially proportional to the alternating current in the current supply conductor 5. The leads 7 and 9 conduct the induced alternating current from the sensor coil 6 to the energy harvester IC 40 in the monitoring circuit 15, on the printed circuit board 4. The energy harvester IC 40 outputs rectified current to the super capacitor 12, the microprocessor 16, and the gate 18. The monitoring circuit 2 operating power is provided by current induced in the current transformer 13 from current in the current supply conductor 5. The monitoring circuit 2 uses the operating power to monitor the current in the current supply conductor 5. The gate 18 outputs a signal on the output line 14 indicating whether current through the current supply conductor 5 is on or off. The output line 14 may provide operational power from the current induced in the current transformer 13, to the door interlock solenoid 22 and/or the display screen 24. The signal on an output line 14 indicates whether current through the current supply conductor 5 is on or off. The door interlock 8 (shown in FIG. 4A) prevents the access door from opening when the signal on the output line indicates that current through the current supply conductor is on. The display indicates whether current through the current supply conductor is on or off. In example embodiments of the invention, the energy requirements of the micro-processor 16 may be sufficiently low to be continuously supplied by the energy harvesting circuit 40.

In an example embodiment of the invention, the current transformer 13 and the monitoring circuit 2 of FIG. 3, are a live wire monitor. The live wire monitor includes the current transformer 13 that is configured to surround a current supply conductor to be monitored in an electrical enclosure. The monitoring circuit is electrically connected to the current transformer. The monitoring circuit's operating power is provided by current induced in the current transformer from current in the current supply conductor. The monitoring circuit uses the operating power to monitor the current in a current supply conductor. The monitoring circuit outputs a signal on an output line to at least one of a display device and a door interlock of a door of an electrical enclosure, indicating whether current through the current supply conductor is on or off. The live wire monitor of may also include an energy storage device in the monitoring circuit. The energy storage device stores energy from the current induced in the current transformer from current in the current supply conductor. The monitoring circuit outputs a portion of the energy stored in the energy storage device, to operate at least one of the door interlock on the electrical enclosure and the display device, when current through the current supply conductor is off. The storage device is the super capacitor 12.

Figure 4A:
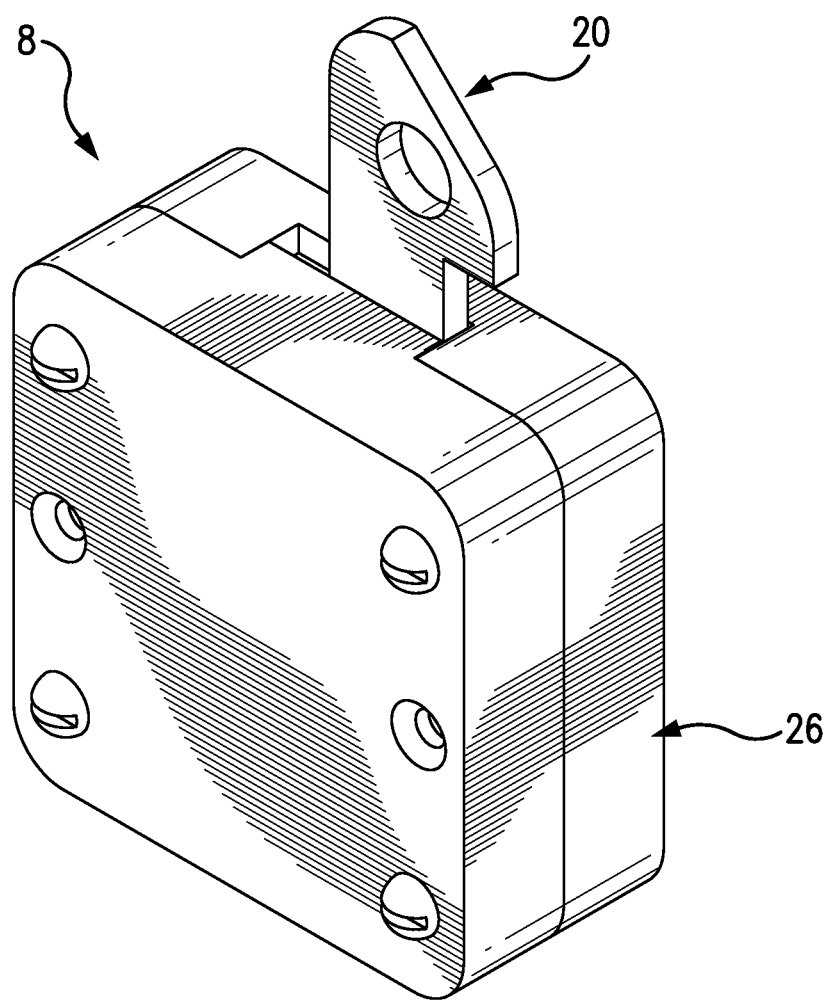
FIG. 4A shows a front perspective view from the bottom left side of an example embodiment of the door interlock and its housing that is to be mounted on the inside of the electrical enclosure housing structure and located proximate to an access door of the electrical enclosure housing structure.

FIG. 4A shows a front perspective view from the bottom left side of an example embodiment of the door interlock 8 and its housing 26 that is to be mounted on the inside of the electrical enclosure housing structure 1 and located proximate to an access door 17 (shown in FIG. 7B-1) of the electrical enclosure housing structure. The figure shows a latch 20 of the door interlock 8, which engages the door 17 (FIG. 7B-1) to fasten the access door 17 shut.

FIG. 4B shows an exploded, front perspective view from the bottom left side of the door interlock 8, illustrating example details of a latch 20 and solenoid 22 of the door interlock 8, which operate in response to the signal on the output line 14 from the supply line monitor 2, indicating whether current through the current supply conductor 5 is on or off. The door interlock 8 includes a biasing spring 23 to urge the latch 20 to rotate on the pivot 34 to fasten the access door 17 when the access door is closed on the housing 1. If the latch 20 is not locked by the latch bolt 30, the operator may push the latch up against the spring 23, to disengage the latch 20 from the door 17 so that the door may be opened. However, when the signal on the output line 14 from the supply line monitor, indicates that the current through the current supply conductor is on, the solenoid drives the latch bolt 30 into the bolt hole 32 of the latch, so that the latch 20 does not disengage from the door, thereby locking the door closed.

Figure 5A:
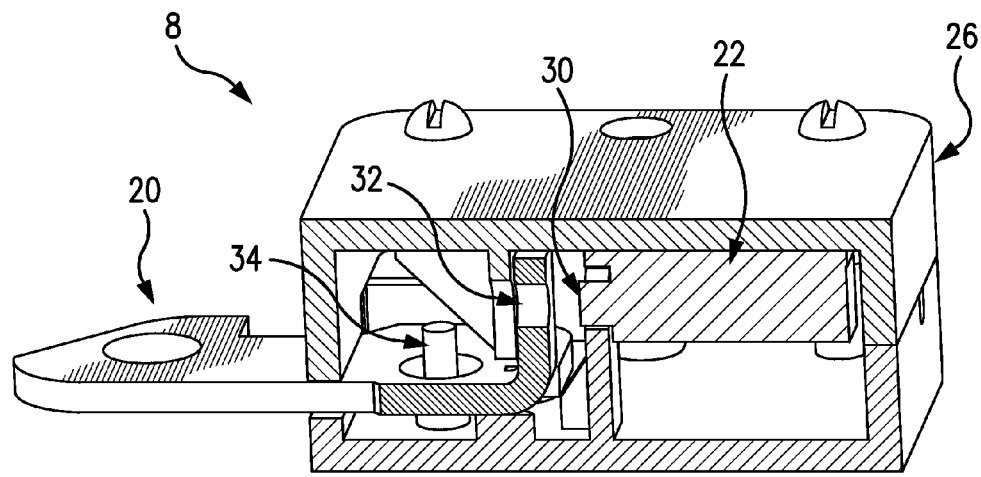
FIG. 5A is a side cross sectional view of the door interlock, illustrating example details of a latch bolt of the solenoid, which is withdrawn by the solenoid from a bolt hole of the latch, to unlock the door of the electrical enclosure housing structure when the signal on the output line from the supply line monitor, indicates that the current through the current supply conductor is off.
Figure 5B:
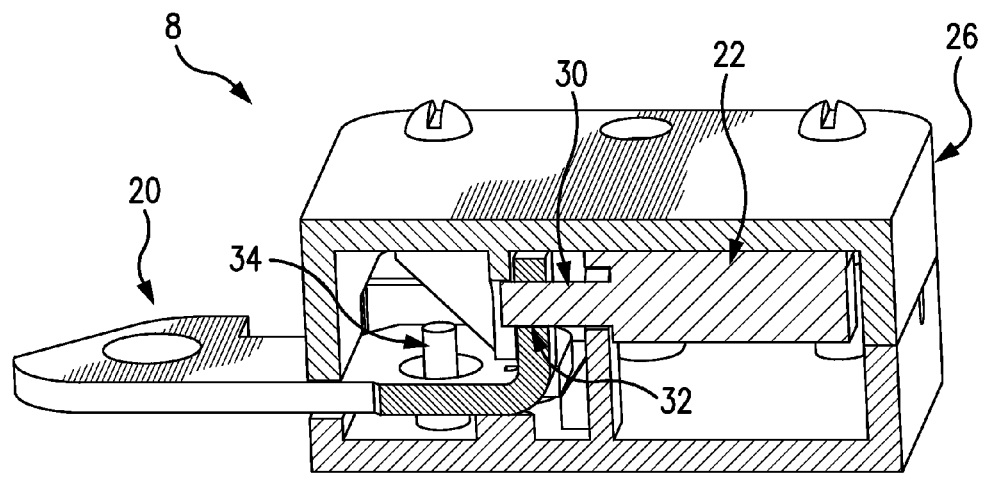

FIG. 5A is a side cross sectional view of the door interlock, illustrating example details of a latch bolt 30 of the solenoid 22, which is withdrawn by the solenoid from the bolt hole 32 of the latch, to unlock the door of the electrical enclosure housing structure when the supply line monitor signal on the output line 14, indicates no current through any of the current supply conductors 5A, 5B, or 5C of FIG. 1, referred to herein generally as 5. FIG. 5B is a side cross sectional view of the door interlock, illustrating the latch bolt 30 of the solenoid 22, which is extended by the solenoid into the bolt hole 32 of the latch, to lock the door of the electrical enclosure housing structure when the signal on the output line 14 from the supply line monitor, indicates that the current through any of the current supply conductors 5A, 5B, or 5C of FIG. 1, is on.

In this example embodiment of the invention, the signal on the output line 14 provides operational power to the door interlock 8 to prevent the access door 17 from opening while there is current through the current supply conductor 5. The signal does not provide operational power to the door interlock 8 when there is no current through a current supply conductor. When there is no current through any current supply conductor 5A, 5B, or 5C of FIG. 1, then the door is unlocked. The monitoring circuit 15 outputs the induced current from the current transformer 13 as the signal on the output line 14, to provide operational power to the door interlock 8 to prevent the access door from opening while there is current through any of the respective current supply conductors 5A, 5B, or 5C of FIG. 1.

Figure 6:
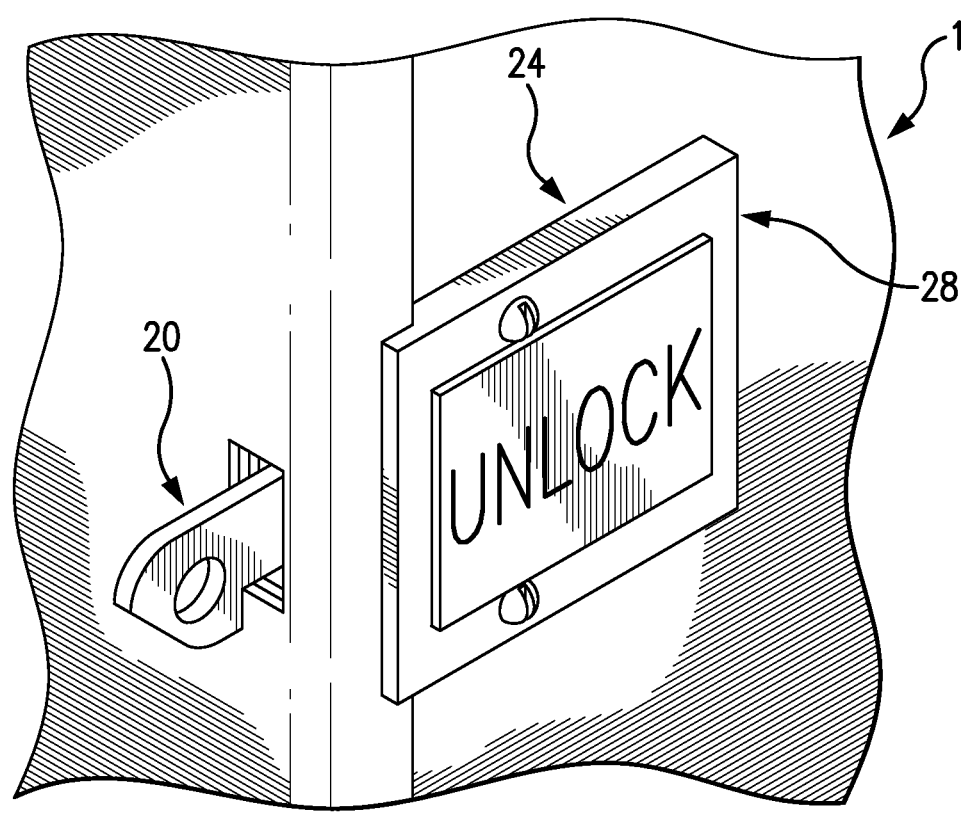
FIG. 6 shows a front perspective view from the top right side of an example embodiment of the display mounted on the outside of the electrical enclosure housing structure indicating that the current through the current supply conductor is off, by showing a message, for example, "UNLOCK".

FIG. 6 shows a front perspective view from the top right side of an example embodiment of the display 24 and its housing 28 that is to be mounted on the outside of the electrical enclosure housing structure 1 in a location conveniently viewed by an operator. The display 24 indicates that the current through the current supply conductor 5 is off, by showing a message, for example, "UNLOCK".

The signal on the output line 14 provides operational power to the display to indicate whether the current through the current supply conductor 5 is on or off, as further discussed below with respect to FIGS. 7B-1 and 7B-2 and the bistable display.

In an alternate example embodiment of the invention, the super capacitor 12 is an energy storage device in the monitoring circuit 2, which stores energy from the current induced in the current transformer 13 from current in the current supply conductor 5. The monitoring circuit 2 is thus configured to provide operational power to the door interlock 8 when current ceases to flow in the current supply conductor 5, thereby powering the door interlock to unlock the door. The monitoring circuit 2 is further configured to provide operational power to the display 24 when current ceases to flow in the current supply conductor 5, thereby powering the display 24 to indicate that current has ceased to flow in the current supply conductor 5.

Figure 7A:
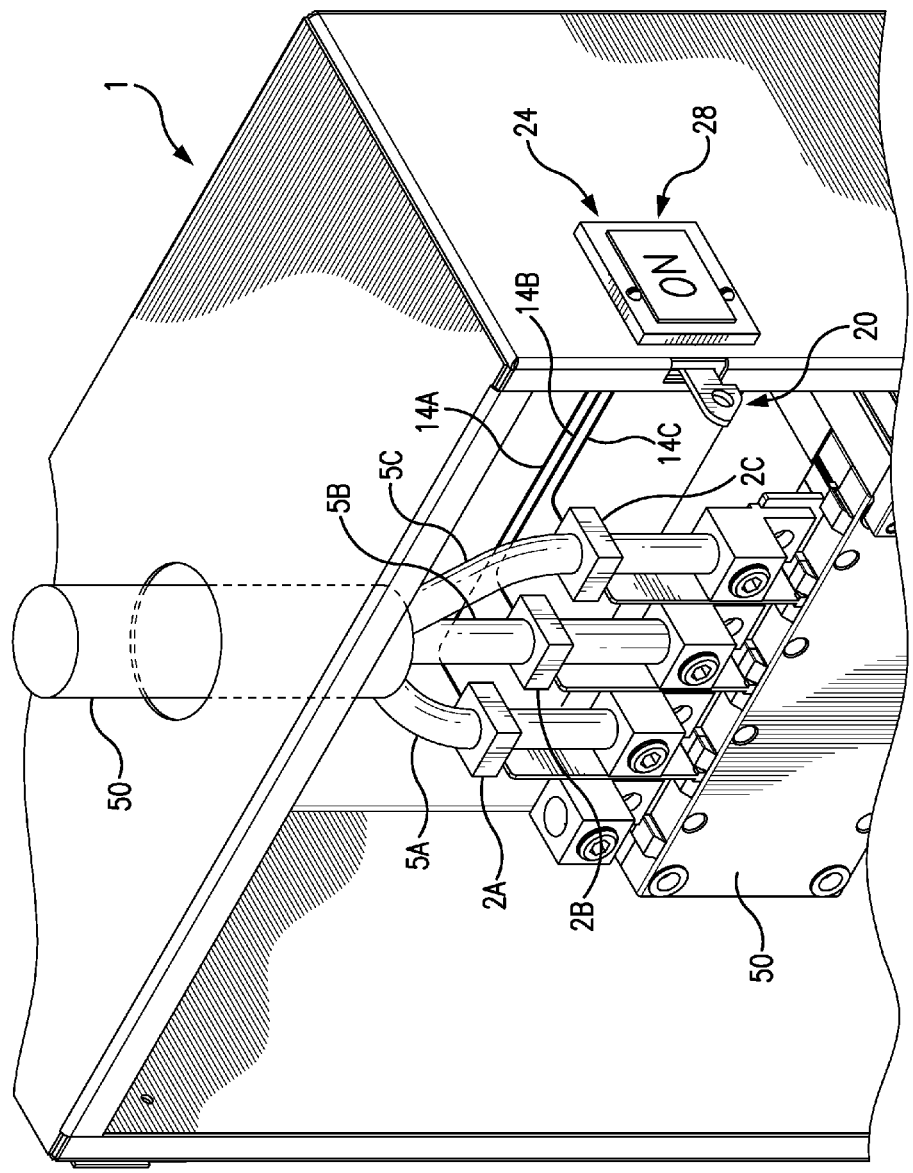
FIG. 7A shows a front perspective view from the top right side of another example embodiment of the electrical enclosure housing structure, shown with the door removed, illustrating the an electrical power supply cable with three current supply conductors, for example, as in a regular residential three wire cable having two hot wires and one neutral wire with a supply line monitor on each wire.

FIG. 7A shows a front perspective view from the top right side of another example embodiment of the electrical enclosure housing structure, shown with the door removed, illustrating the example electrical power supply cable 50 shown in the figure, includes three current supply conductors 5A, 5B, and 5C. The example electrical power supply cable 50 may be, for example, a regular residential three wire cable having two hot wires 5A and 5B and one neutral wire 5C. A supply line monitor 2A surrounds the hot wire 5A to monitor wire 5A and to harvest energy. The output line 14A from supply line monitor 2A is connected to the display device 24 to indicate whether current through the hot wire 5A is on or off. The output line 14A from supply line monitor 2A is connected to the door interlock, to prevent the door of the electrical housing from opening when the signal on the output line 14A indicates that the current is on.

A supply line monitor 2B surrounds the hot wire B to monitor wire 5B and to harvest energy. The output line 14B from supply line monitor 2B is connected to the display device 24 to indicate whether current through the hot wire 5B is on or off. The output line 14B from supply line monitor 2B is connected to the door interlock, to prevent the door of the electrical housing from opening when the signal on the output line 14B indicates that the current is on.

A supply line monitor 2C surrounds the neutral wire 5C to harvest energy. The output line 14C from supply line monitor 2C is connected to the display device 24 to provide energy. The output line 14C from supply line monitor 2C is connected to the door interlock, to provide energy.

The display 24 may be a bistable display having a first stable state indicating that the current through any current supply conductor 5A, 5B, or 5C is on and a second stable state indicating that the current through all current supply conductors 5A, 5B, and 5C is off. The super capacitor 12 then powers the change of state. FIG. 7B-1 shows a front perspective view from the top right side of an example embodiment of the electrical enclosure housing structure 1, with the display 24 indicating that the current through any current supply conductor 5A, 5B, or 5C is on, by showing a message, for example, "ON".

Figures 1, 7B:
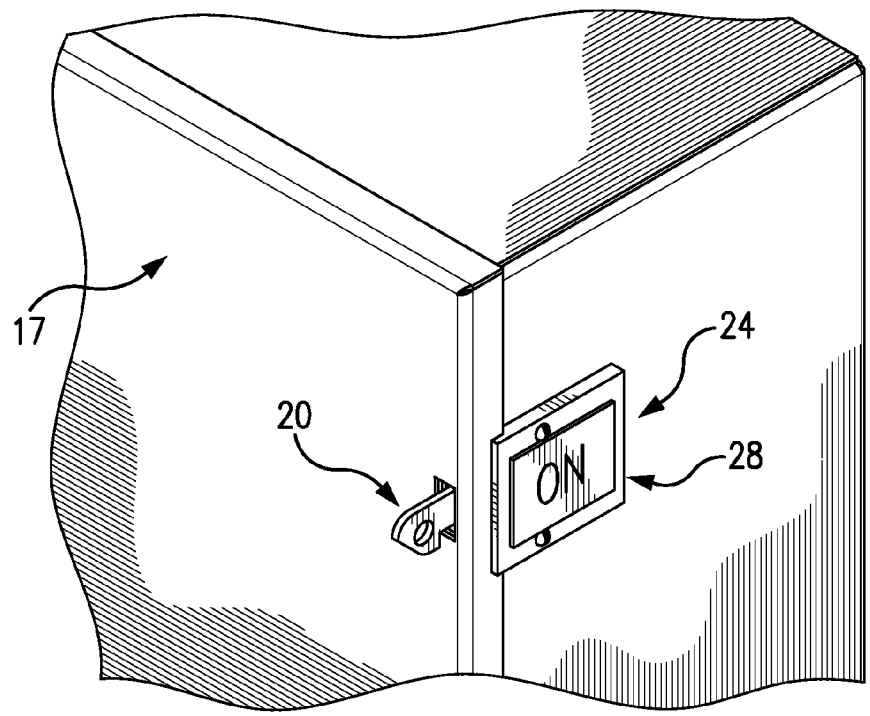
Figures 2, 7B:
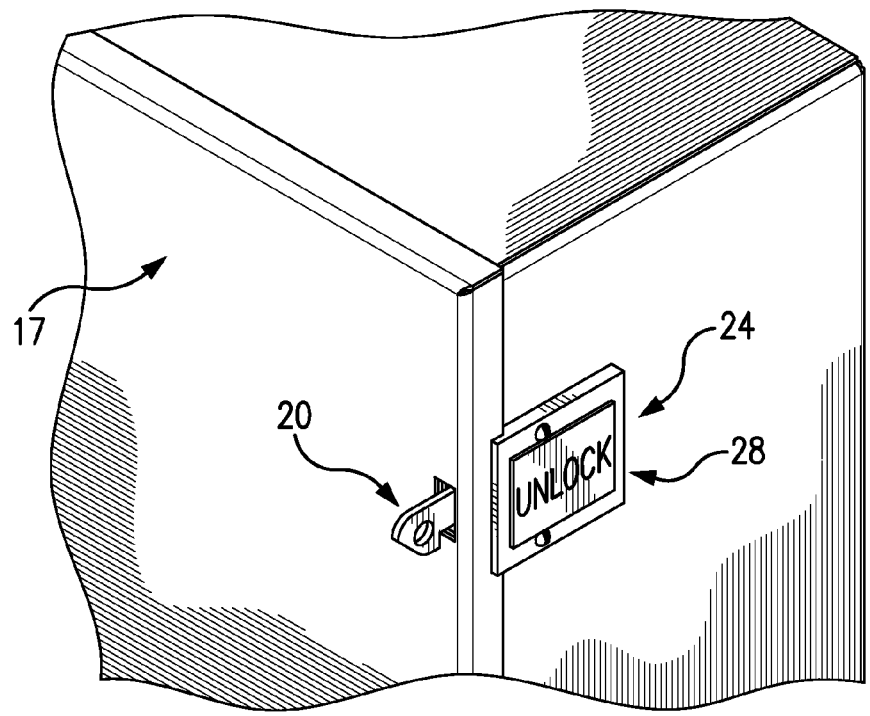

FIG. 7B-2 shows a front perspective view from the top right side of an example embodiment of the electrical enclosure housing structure 1, with the display 24 indicating that the current through all current supply conductors 5A, 5B, and 5C is off, by showing a message, for example, "UNLOCK".

In example embodiments, the display 24 may be positioned on the front of the door 17, for convenient viewing.

In example embodiments, the output line 14 may comprise a first output line that provides operational power to the door interlock 8 and the display 24 and a second output line that indicates to the display 24 whether current through the current supply conductor is on or off.

In example embodiments, the electrical power supply cable 50 may have three current supply conductors with two hot wires of opposite phase, and one neutral wire. In another example embodiment, the electrical power supply cable 50 may have three current supply conductors in a three phase application. In another example embodiment, the electrical power supply cable 50 may have four current supply conductors in a three phase application that includes a fourth wire with a neutral phase.

Although specific example embodiments of the invention have been disclosed, persons of skill in the art will appreciate that changes may be made to the details described for the specific example embodiments, without departing from the spirit and the scope of the invention.

The invention claimed is:

1. An electrical enclosure, comprising:
   a housing structure containing a current supply conductor and at least one electrical device;
   a current transformer surrounding the current supply conductor; and
   a monitoring circuit electrically connected to the current transformer, the monitoring circuit's operating power being provided by current induced in the current transformer from current in the current supply conductor, the monitoring circuit to use the operating power to monitor the current in the current supply conductor, the monitoring circuit to output a signal on an output line indicating whether current through the current supply conductor is on or off.

2. The electrical enclosure of claim 1, further comprising:
   an access door mounted on the housing structure;
   a door interlock mounted on the housing structure and located proximate to the access door of the housing structure, the door interlock being coupled to the output line from the monitoring circuit, the door interlock to prevent the access door from opening when the signal on the output line indicates that current through the current supply conductor is on.

3. The electrical enclosure of claim 2, wherein the monitoring circuit comprises an output of the induced current from the current transformer as the signal on the output line to provide operational power to the door interlock to prevent the access door from opening while there is current through the current supply conductor, and the signal does not provide operational power to the door interlock when there is no current through the current supply conductor, thereby unlocking the door.

4. The electrical enclosure of claim 2, further comprising:
   an energy storage device in the monitoring circuit, the energy storage device to store energy from the current induced in the current transformer from current in the current supply conductor; and
   the monitoring circuit further configured to provide operational power to the door interlock when current ceases to flow in the current supply conductor, thereby powering the door interlock to unlock the door.

5. The electrical enclosure of claim 1, further comprising:
   a display mounted on the housing structure, the display being coupled to the output line from the monitoring circuit, the display to indicate whether current through the current supply conductor is on or off.

6. The electrical enclosure of claim 5, wherein the signal on the output line provides operational power to the display to indicate whether the current through the current supply conductor is on or off.

7. The electrical enclosure of claim 5, further comprising:
   an energy storage device in the monitoring circuit, the energy storage device to store energy from the current induced in the current transformer from current in the current supply conductor; and
   the monitoring circuit further configured to provide operational power to the display when current ceases to flow in the current supply conductor, thereby powering the display to indicate that current has ceased to flow in the current supply conductor.

8. The electrical enclosure of claim 5, further comprising:
   an access door mounted on the housing structure;
   a door interlock mounted on the housing structure and located proximate to the access door of the housing structure, the door interlock being coupled to the output line from the monitoring circuit, the door interlock to prevent the access door from opening when the signal on the output line indicates that current through the current supply conductor is on.

9. The electrical enclosure of claim 8, wherein the signal on the output line provides operational power to the door interlock to prevent the access door from opening while there is current through the current supply conductor, and the signal does not provide operational power to the door interlock when there is no current through the current supply conductor, thereby unlocking the door.

10. The electrical enclosure of claim 9, wherein the signal on the output line provides operational power to enable the display to indicate whether the current through the current supply conductor is on or off.

11. The electrical enclosure of claim 10, wherein the output line comprises a first output line that provides operational power to the door interlock and a second output line that indicates to the display a flow of current through the current supply conductor.

12. The electrical enclosure of claim 8, further comprising:
   an energy storage device in the monitoring circuit, the energy storage device to store energy from the current induced in the current transformer; and
   the monitoring circuit further configured to provide operational power to the door interlock when current ceases to flow in the current supply conductor, thereby powering the door interlock to unlock the door.

13. The electrical enclosure of claim 12, wherein the storage device is a capacitor.

14. The electrical enclosure of claim 5, wherein the display is a bistable display having a first stable state indicating that the current through the current supply conductor is on and a second stable state indicating that the current through the current supply conductor is off.

15. A live wire monitor, comprising:
   a current transformer surrounding a current supply conductor to be monitored in an electrical enclosure;
   a monitoring circuit electrically connected to the current transformer, the monitoring circuit's operating power being provided by current induced in the current transformer from current in the current supply conductor, the monitoring circuit to use the operating power to monitor the current in the current supply conductor, the monitoring circuit to output a signal on an output line to at least one of a display device and a door interlock of a door of the electrical enclosure, indicating whether current through the current supply conductor is on or off.

16. The live wire monitor of claim 15, further comprising:
an energy storage device in the monitoring circuit, the energy storage device to store energy from the current induced in the current transformer from current in the current supply conductor; and
the monitoring circuit to output a portion of the energy stored in the energy storage device, to operate at least one of the door interlock on the electrical enclosure and the display device, when current through the current supply conductor is off.

17. The live wire monitor of claim 16, wherein the storage device is a capacitor.

* * * * *